US012548483B2

(12) United States Patent
Cho et al.

(10) Patent No.: US 12,548,483 B2
(45) Date of Patent: Feb. 10, 2026

(54) DRIVING CIRCUIT BOARD HAVING INSPECTION FUNCTION, DISPLAY APPARATUS INCLUDING DRIVING CIRCUIT BOARD HAVING INSPECTION FUNCTION, AND METHOD OF CONTROLLING INSPECTION OF DRIVING CIRCUIT BOARD HAVING INSPECTION FUNCTION

(71) Applicant: SAPIEN SEMICONDUCTORS INC., Gyeonggi-do (KR)

(72) Inventors: In Young Cho, Gyeonggi-do (KR); Dae Young Jung, Gyeonggi-do (KR); Hyun Tae Jung, Gyeonggi-do (KR); Jong Gu Jeon, Gyeonggi-do (KR)

(73) Assignee: SAPIEN SEMICONDUCTORS INC., Gyeonggi-do (KR)

( * ) Notice: Subject to any disclaimer, the term of this patent is extended or adjusted under 35 U.S.C. 154(b) by 0 days.

(21) Appl. No.: 18/789,607

(22) Filed: Jul. 30, 2024

(65) Prior Publication Data

US 2025/0054425 A1 Feb. 13, 2025

(30) Foreign Application Priority Data

Aug. 11, 2023 (KR) ........................ 10-2023-0105769

(51) Int. Cl.

| | |
|---|---|
| ***G09G 3/00*** | (2006.01) |
| ***G09G 3/32*** | (2016.01) |
| ***H10H 29/14*** | (2025.01) |

(52) U.S. Cl.

CPC ............... *G09G 3/006* (2013.01); *G09G 3/32* (2013.01); *G09G 2330/12* (2013.01); *H10H 29/142* (2025.01)

(58) Field of Classification Search

None

See application file for complete search history.

(56) References Cited

U.S. PATENT DOCUMENTS

2023/0023470 A1* 1/2023 Lee .......................... G09G 3/32
2023/0343257 A1* 10/2023 Lee ........................ G09G 3/006

FOREIGN PATENT DOCUMENTS

KR 10-2147401 B1 8/2020

* cited by examiner

*Primary Examiner* — Ifedayo B Iluyomade

(74) *Attorney, Agent, or Firm* — Eschweiler & Potashnik, LLC; Harris Kim

(57) ABSTRACT

Provided are a driving circuit board having an inspection function, a display apparatus including a driving circuit board having an inspection function, and a method of controlling inspection of a driving circuit board having an inspection function. The driving circuit board includes a driving circuit array including a plurality of driving circuits and at least one processor configured to control inspection on the plurality of driving circuits in an inspection mode, in which the at least one processor is further configured to divide the driving circuit array into one or more blocks, control first inspection to inspect an operation of the plurality of driving circuits in units of the one or more blocks, select an additional inspection driving circuit, based on a result of the first inspection, and control second inspection to inspect an operation of the additional inspection driving circuit.

11 Claims, 11 Drawing Sheets

DRIVING CIRCUIT BOARD HAVING INSPECTION FUNCTION, DISPLAY APPARATUS INCLUDING DRIVING CIRCUIT BOARD HAVING INSPECTION FUNCTION, AND METHOD OF CONTROLLING INSPECTION OF DRIVING CIRCUIT BOARD HAVING INSPECTION FUNCTION

CROSS-REFERENCE TO RELATED APPLICATION

This application is based on and claims priority under 35 USC § 119 to Korean Patent Application No. 10-2023-0105769, filed on Aug. 11, 2023, in the Korean Intellectual Property Office, the disclosure of which is incorporated by reference herein in its entirety.

TECHNICAL FIELD

The present disclosure relates to a driving circuit board having an inspection function, a display apparatus including a driving circuit board having an inspection function, and a method of controlling inspection of a driving circuit board having an inspection function.

BACKGROUND

As a next-generation display technology, micro light-emitting diodes (LEDs) are in the spotlight for the demand for small-size displays or high-quality image output. Micro LEDs have advantages over existing display technologies, such as small size, high contrast ratio, fast response speed, brightness, etc.

Meanwhile, recent industries require high integration and low power consumption, and to this end, pixels or display devices are produced by bonding a backplane including a driving circuit to a light-emitting device substrate including a light-emitting device.

However, when whether normal driving is performed is inspected in a bonded state of the backplane and the light-emitting device substrate, even in case of a problem, it is difficult to find out whether the problem is related to the backplane or the light-emitting device substrate.

The above-mentioned background technology is technical information that the inventor possessed for deriving the present disclosure or acquired in the process of deriving the present disclosure, and may not be necessarily said to be known art disclosed to the general public before filing the application of the present disclosure.

BRIEF SUMMARY

Provided are a driving circuit board having an inspection function, a display apparatus including a driving circuit board having an inspection function, and a method of controlling inspection of a driving circuit board having an inspection function. The problem that the present disclosure aims to solve is not limited to the problems mentioned above, and other problems and advantages of the present disclosure that are not mentioned can be understood through the following description and can be understood more clearly by the examples of the present disclosure. In addition, it will be appreciated that the problems and advantages to be solved by the present disclosure may be realized by means and combinations thereof indicated in the claims.

Additional aspects will be set forth in part in the description which follows and, in part, will be apparent from the description, or may be learned by practice of the presented embodiments of the disclosure.

According to a first aspect of the present disclosure, a driving circuit board includes a driving circuit array including a plurality of driving circuits and at least one processor configured to control inspection on the plurality of driving circuits in an inspection mode, in which the at least one processor is further configured to divide the driving circuit array into one or more blocks, control first inspection to inspect an operation of the plurality of driving circuits in units of the one or more blocks, select an additional inspection driving circuit, based on a result of the first inspection, and control second inspection to inspect an operation of the additional inspection driving circuit.

According to a second aspect of the present disclosure, a display apparatus includes a light-emitting array including a plurality of light-emitting devices and a driving circuit board, in which the driving circuit board is the driving circuit board according to the first aspect.

According to a third aspect of the present disclosure, a method of controlling inspection of a driving circuit board includes dividing a driving circuit array including a plurality of driving circuits into one or more blocks, controlling first inspection to inspect an operation of the plurality of driving circuits in units of the one or more blocks, selecting an additional inspection driving circuit, based on a result of the first inspection, and controlling second inspection to inspect an operation of the additional inspection driving circuit.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
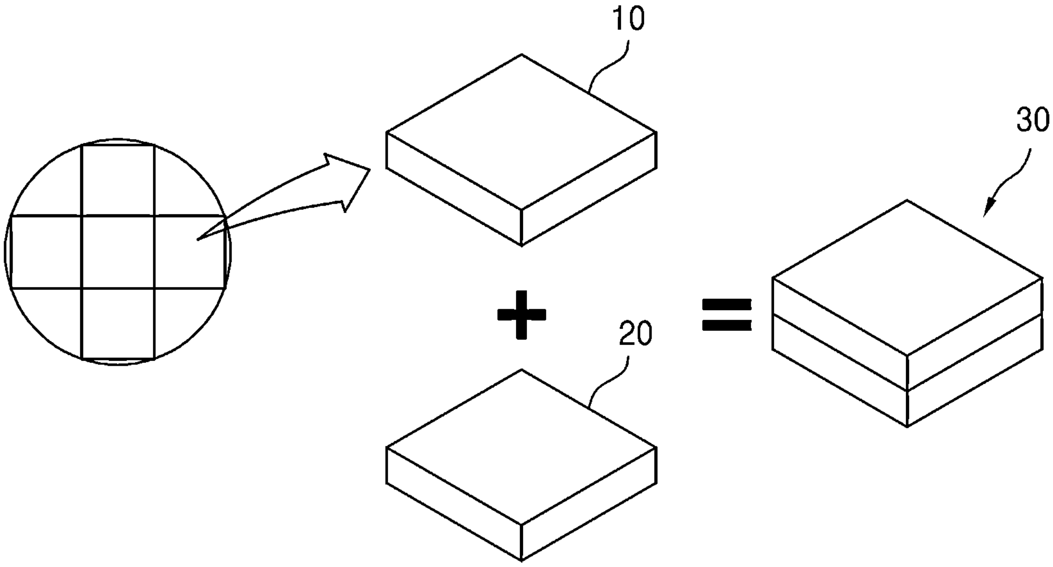
FIG. 1 is a diagram schematically showing a manufacturing process of a display apparatus according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Advantages and features of the present disclosure, and a method of achieving them will be apparent with reference to the embodiments described in detail in conjunction with the drawings. However, the present disclosure is not limited to the embodiments presented below, but may be implemented in various different forms, and should be understood to include all transformations, equivalents, and substitutes included in the spirit and technical scope of the present disclosure. Embodiments presented below are provided to complete the disclosure of the present disclosure and perfectly inform those of ordinary skill in the art of the category of the present disclosure. In describing the present disclosure, if it is determined that a detailed description of related known technologies may obscure the gist of the present disclosure, the detailed description thereof will be omitted.

The terms used in the embodiments are general terms that are currently widely used as much as possible, but may vary depending on the intention or precedent of a person working in the art, the emergence of new technology, etc. In addition, in a specific case, the applicant voluntarily may select terms, and in this case, the meaning of the terms may be disclosed in a corresponding description part of the disclosure. Thus, the terms used in herein should be defined not by the simple names of the terms but by the meaning of the terms and the contents throughout the specification.

The term used herein is used to describe particular embodiments, and is not intended to limit the present disclosure. Singular forms may include plural forms unless apparently indicated otherwise contextually. Herein, it should be understood that the term "include", "have", or the like used herein is to indicate the presence of features, numbers, steps, operations, components, parts, or a combination thereof described in the specifications, and does not preclude the presence or addition of one or more other features, numbers, steps, operations, components, parts, or a combination thereof.

In addition, terminology, such as "first" or "second" used herein, can be used to describe various components, but the components should not be limited by the terms. These terms are used to distinguish one component from another component.

In the entire specification, when a part "includes" a certain element, it means that other elements may be further included, rather than excluding other elements, unless stated otherwise. In addition, the terms ". . . unit" and ". . . module" refer to a unit that processes at least one function or operation, which may be implemented as hardware (for example, at least one processor or at least one electrical circuit) or software, or a combination of hardware and software.

In the following embodiment, "ON" used in connection with a device state may refer to an activated state of the device, and "OFF" may refer to a deactivated state of the device. "ON", as used in connection with a signal received by a device, may refer to a signal that activates the device, and "OFF" may refer to a signal that deactivates the device. The device may be activated by high or low voltage. For example, a P-type transistor may be activated by low voltage. An N-type transistor may be activated by high voltage. Accordingly, it should be understood that "ON" voltages for a P-type transistor and an N-type transistor have opposite (low vs. high) voltage levels.

When one element is referred to as being "connected to" another element, it includes both direct connection to the other element or intervening another element therebetween.

Hereinafter, specific embodiments of the present disclosure will be described in detail with reference to the drawings.

In addition, in describing the disclosure in detail, if it is determined that a detailed description of a related known function or configuration may unnecessarily obscure the subject matter of the disclosure, the detailed description will be omitted.

FIG. 1 is a diagram schematically showing a manufacturing process of a display apparatus according to an embodiment of the present disclosure.

Referring to FIG. 1, a display apparatus 30 according to an embodiment may include a light-emitting device array 10 and a driving circuit board 20. The light-emitting device array 10 may be coupled to the driving circuit board 20.

The light-emitting device array 10 may include a plurality of light-emitting devices. The light-emitting device may be a light-emitting diode (LED). At least one light-emitting device array may be manufactured by growing a plurality of light-emitting diodes on a semiconductor wafer SW. Accordingly, the display apparatus 30 may be manufactured by coupling the light-emitting device array 10 to the driving circuit board 20 without a need to individually transfer the light-emitting diodes to the driving circuit board 20.

A driving circuit corresponding to each light-emitting device on the light-emitting device array 10 may be arranged on the driving circuit board 20. The light-emitting device on the light-emitting device array 10 and the driving circuit on the driving circuit board 20 may be electrically connected to form a pixel PX. The driving circuit board 20 may also include a driving circuit array manufactured by growing a plurality of driving circuits on the semiconductor wafer SW.

Meanwhile, before bonding the driving circuit board 20 to the light-emitting device array 10, it is common to open a light-emitting device connection portion for connection to the light-emitting devices in the driving circuit included in the driving circuit board 20.

One way to inspect whether driving circuits are produced normally and operate normally after manufacturing the driving circuit board 20 (or a driving circuit array) may be connecting the output of the open light-emitting device connection portion of the driving circuit to the outside. However, the driving circuit board 20 may include several millions of driving circuits, and it may be impossible or inefficient to connect the output of the connection portion corresponding to the several millions to the outside.

Another inspection method may be checking an operation of the display apparatus 30 by coupling the light-emitting device array 10 to the driving circuit board 20. However, this method may not identify whether a problem occurring in the display apparatus 30 is a problem of the light-emitting device array 10 or a problem of the driving circuit board 20.

Accordingly, the present disclosure presents a driving circuit board and a display apparatus in which an operation of the driving circuit board 20 may be individually inspected and individual electric characteristics may be identified.

Figure 2:
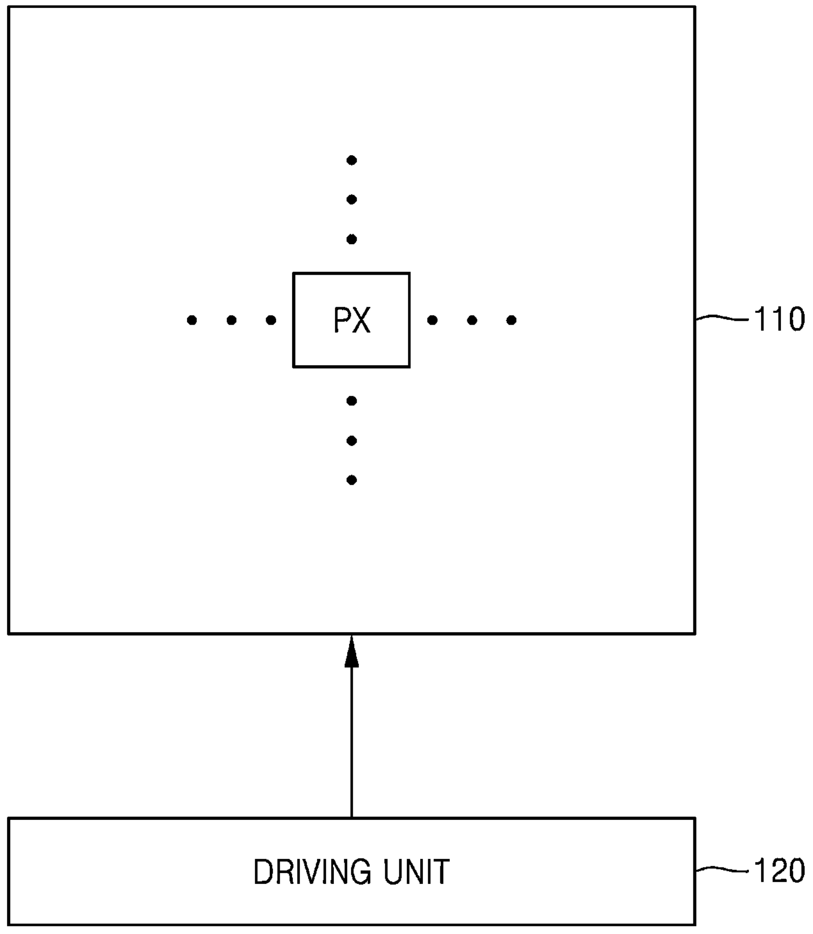
FIG. 2 is a diagram schematically showing a display apparatus according to an embodiment of the present disclosure.

FIG. 2 is a diagram schematically showing a display apparatus according to an embodiment of the present disclosure.

Referring to FIG. 2, the display apparatus may include a pixel unit 110 and a driving unit 120. The display apparatus of FIG. 2 may correspond to the display apparatus 30 described above with reference to FIG. 1.

The pixel unit 110 may display an image using an n-bit digital image signal capable of representing 1 to $2^n$ gray scales. The pixel unit 110 may include a plurality of pixels PX arranged in various patterns such as a predetermined pattern, for example, a matrix pattern, a zigzag pattern, etc. The pixel PX may emit one color, for example, one of red, blue, green, and white. The pixel PX may emit colors other than red, blue, green, and white.

The pixel PX may include a light-emitting device. The light-emitting device may be a self-luminous device. For example, the light-emitting device may be a light-emitting diode (LED). The light-emitting device may be a micro-scale to nano-scale LED. The light-emitting device may emit light at a single peak wavelength or may emit light at a plurality of peak wavelengths.

The pixel PX may further include a driving circuit connected to the light-emitting device. The driving circuit may be implemented by a semiconductor stacked structure on a substrate.

The driving unit 120 may drive and control the pixel unit 110. The driving unit 120 may include a control unit (not shown), a gamma setting unit (not shown), a data driving unit (not shown), a current supplying unit (not shown), and a clock generating unit (not shown), but details will be described later.

Figure 3:
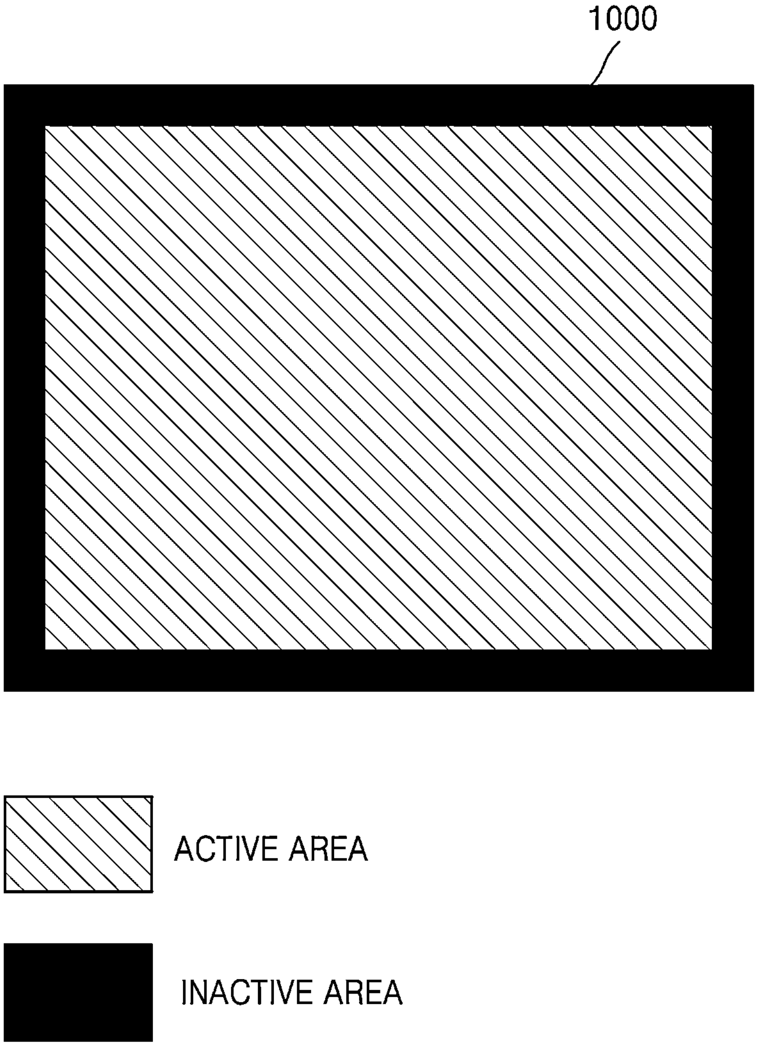
FIG. 3 is a schematic diagram for describing an active area and an inactive area of a driving circuit unit, according to an embodiment of the present disclosure.

FIG. 3 is a schematic diagram for describing an active area and an inactive area of a driving circuit unit, according to an embodiment of the present disclosure.

As shown in FIG. 3, a driving circuit unit 1000 according to an embodiment of the present disclosure may include an active area and an inactive area.

In the present disclosure, an active area may refer to an area associated with light emission and non-light emission of a light-emitting device in a driving mode. The driving mode may refer to a state in which a light-emitting device is driven by a driving circuit in order for the display apparatus to display input image data. In an embodiment, the active area may include one or more driving circuits.

In the present disclosure, an inactive area or a dummy area may refer to an area that is not associated with light emission or non-light emission of a light-emitting device in a driving mode. The inactive area may be an area for protecting the active area directly related to light emission and non-light emission of the light-emitting device, and may be an area that may occur during the production of a driving circuit board or a display apparatus. For the purpose of protecting the active area, the inactive area may be formed to surround the active area. Accordingly, as shown in FIG. 3, the inactive area may be formed at each corner of the driving circuit unit 1000.

Thus, the inactive area may include one or more driving circuits, but the driving circuit included in the inactive area may not operate normally in the driving mode. That is, the driving circuit included in the inactive area may not be associated with light emission or non-light emission based on image data. In an embodiment, the driving circuit included in the inactive area of the display apparatus may not be connected to the light-emitting device. For example, the driving circuit included in the inactive area may have an open point corresponding to a portion connected to the light-emitting device.

The driving circuit board according to the present disclosure may implement an inspection function by using the inactive area included in the driving circuit unit 1000. In the present disclosure, a region of the inactive area, utilized to implement the inspection function, may be referred to as an inspection function implementation area.

Meanwhile, referring to FIG. 3, it is shown that an inactive area is formed at each corner of the rectangular driving circuit unit 1000, but an inactive area may be located arbitrarily within the driving circuit unit 1000. However, when the driving circuit unit 1000 includes a rectangular array of driving circuits, the inactive area may be preferably located at the edge of the driving circuit unit 1000.

The inactive area may include driving circuits in a row direction (i.e., of at least one column) or in a column direction (i.e., of at least one row), in the driving circuit unit 1000. The position of the inactive area does not affect the manner of implementing the inspection function of the present disclosure and does not limit the present disclosure.

Accordingly, hereinafter, the driving circuit board and the display apparatus according to the present disclosure will be described on an embodiment that the inactive area includes the last rows among one or more rows including one or more driving circuits.

Figure 4A:
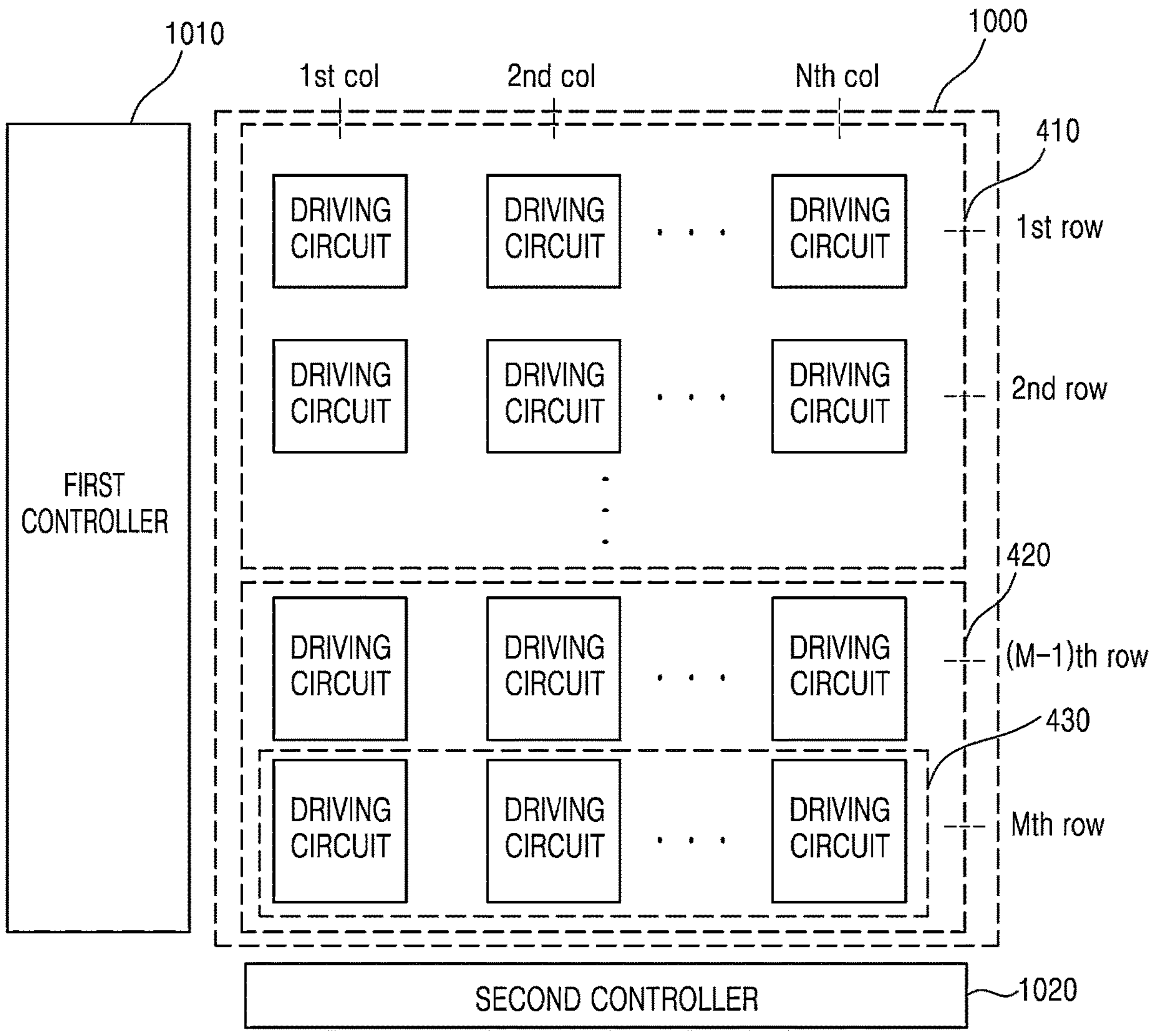
FIGS. 4A and 4B are schematic diagrams for describing an inspection function implementation area according to an embodiment of the present disclosure.
Figure 4B:
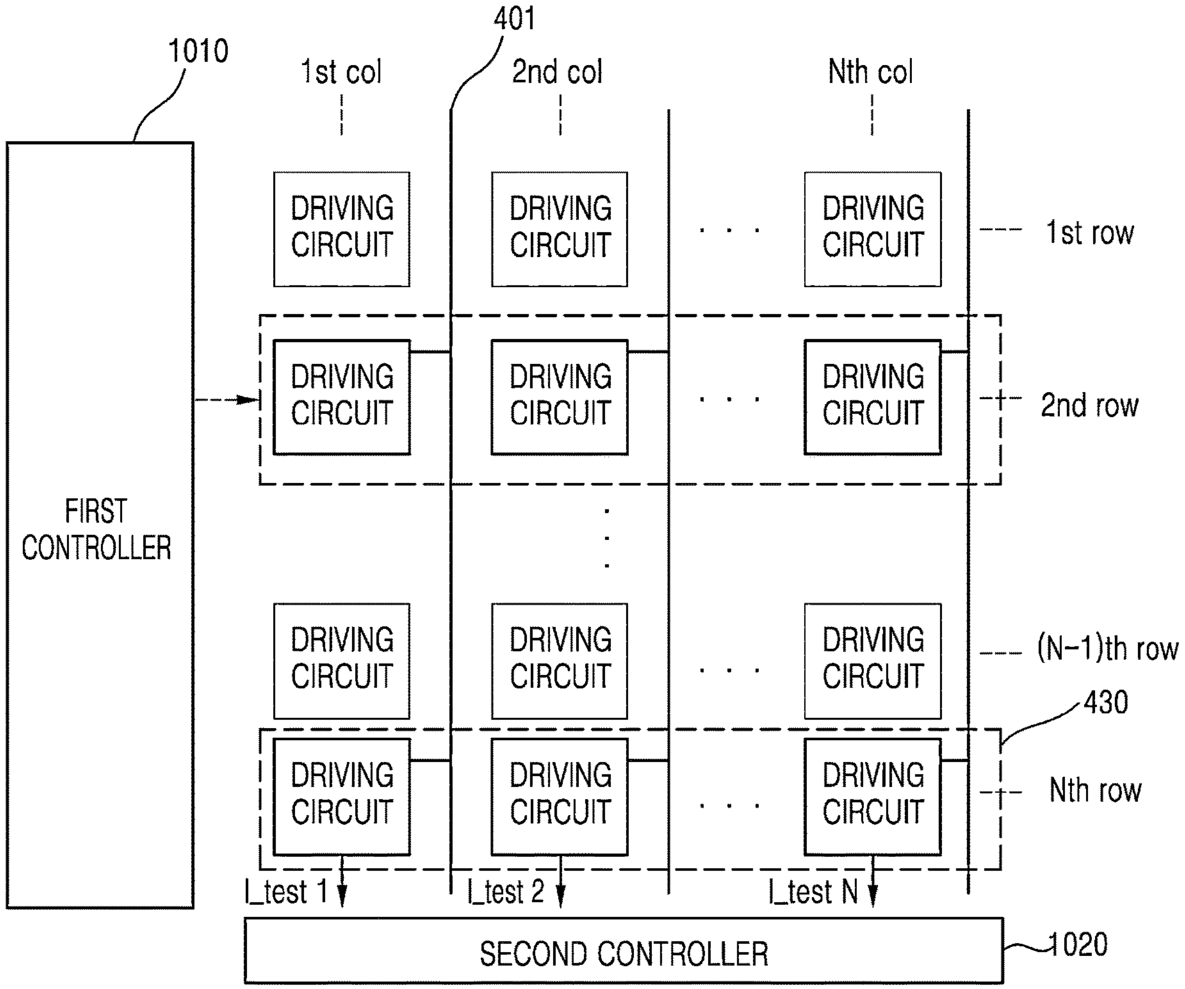

FIGS. 4A and 4B are diagrams schematically showing a driving circuit board according to an embodiment of the present disclosure.

The driving circuit board of FIGS. 4A and 4B may correspond to the driving circuit board 20 described above with reference to FIG. 1.

Referring to FIG. 4A, a driving circuit board may include the driving circuit unit 1000.

The driving circuit unit 1000 may include an array of a plurality of driving circuits arranged in various patterns such as a predetermined pattern, for example, a matrix pattern, a zigzag pattern, etc. FIGS. 4A and 4B show an array of a plurality of driving circuits arranged in a matrix pattern.

In an embodiment, the driving circuit array may include a plurality of driving circuits and may include columns and rows including the driving circuits. Specifically, the driving circuit array may form one or more rows including one or more driving circuits and one or more columns including one or more driving circuits. In an example shown in FIG. 4A, the driving circuit unit 1000 may include a driving circuit array including M rows and N columns.

For convenience of a description, a specific configuration of the driving circuit is not shown in FIGS. 4A and 4B, but will be described in detail in FIG. 10.

In an embodiment, the driving circuit may include a component for controlling light emission and non-light emission of the light-emitting device in response to a control signal (hereinafter, referred to as a control signal switch for convenience of a description) after the driving circuit unit and the light-emitting device array are coupled, and a component for transmitting driving current to the light-emitting device.

Meanwhile, the driving circuit according to an embodiment of the present disclosure may be characterized by being able to implement inspection of the driving circuits before the driving circuit unit and the light-emitting device array are coupled, such that the driving circuit unit 1000 shown in FIGS. 4A and 4B may be considered as not being coupled to the light-emitting device array. In other words, the driving circuits shown in FIGS. 4A and 4B may be considered as not being coupled to the light-emitting device.

Thus, in an embodiment, the driving circuit included in the active area 410 is not electrically connected to the light-emitting device, and thus a configuration through which the driving current is transmitted may be incomplete. For example, in the driving circuit included in the active area 410, a conductive wire of a portion through which the driving current flows may be open.

However, a control signal switch of the driving circuit included in the active area 410 may operate normally. That is, it may be inspected whether the driving circuit according to an embodiment of the present disclosure may normally control light emission and non-light emission of the light-emitting device in response to the control signal, and the control signal switch may normally operate independently of the coupling to the light-emitting device. Whether light emission and non-light emission of the light-emitting device may be normally controlled in response to the control signal may be inspected by measuring current through an electrical connection between the driving circuit included in the active area 410 and a driving circuit included in an inspection function implementation area 430, as will be described below. Meanwhile, in an embodiment, a control signal switch of a specific driving circuit may be implemented to operate independently of whether the driving circuit is subject to an inspection function. In another embodiment, the control signal switch of the specific driving circuit may be implemented to be "ON" when that driving circuit is subject to the inspection function. On the other hand, as the driving circuit included in the inactive area 420 may not operate normally in the driving mode, the control signal switch of the driving circuit included in the inactive area 420 may not operate normally. For example, the control signal switch of the driving circuit included in the inactive area 420 may be open.

As will be described later, the driving circuit board according to the present disclosure may implement the inspection function by forming an electrical connection between a driving circuit to be inspected and the driving circuit included in the inspection function implementation area 430. Accordingly, unlike the driving circuit included in the active area 410, the driving circuit included in the inspection function implementation area 430 may be configured to allow current to flow through the electrical connection formed between the driving circuit to be inspected and the driving circuit included in the inspection function implementation area 430.

Implementation of the inspection function will be described below, assuming the characteristics of the driving circuit in each area described above.

In an embodiment, a driving circuit board may include a first controller 1010 and a second controller 1020.

In an embodiment, the first controller 1010 and the second controller 1020 may be connected to a plurality of driving circuits included in the driving circuit unit 1000. Specifically, the first controller 1010 may be connected to each of one or more rows, and in an embodiment, one or more rows connected to the first controller 1010 may be included in the active area 410. The second controller 1020 may be connected to each of one or more columns, and in an embodiment, one or more rows connected to the second controller 1020 may be included in the active area 410. In other words, the first controller 1010 and the second controller 1020 may be connected to each row and column included in the active area 410. In FIGS. 4A and 4B, for convenience of a description, the connection between the first controller or the second controller and the driving circuits is omitted.

In the present disclosure, the first controller 1010 and the second controller 1020 may set a driving circuit to be inspected in an inspection mode. In the inspection mode, the first controller 1010 and the second controller 1020 may generate and supply a signal according to a control signal (e.g., generated by a controller 121 described below), and the operation of the driving circuits in the inspection mode according to the present disclosure may be controlled by the supplied signal. The inspection mode may refer to a state for inspecting whether a manufactured driving circuit board has been manufactured normally.

Meanwhile, each of the first controller 1010 and the second controller 1020 may be included in a clock generating unit (described later) or a data driving unit (described later), or may be configured separately from the clock generating unit or data driving unit.

For example, each of the first controller 1010 and the second controller 1020 may be implemented as at least one processor or at least one electrical circuit. The processor may be implemented as an array of a plurality of logic gates, or may be implemented as a combination of a general-purpose microprocessor and a memory storing a program executable by the microprocessor. For example, the processor may include a general-purpose processor, a central processing unit (CPU), a microprocessor, a digital signal processor (DSP), a controller, a microcontroller, a state machine, etc. In some environments, the processor may include an application-specific integrated circuit (ASIC), a programmable logic device (PLD), a field-programmable gate array (FPGA), etc. For example, processor may refer to a combination of processing devices, such as a combination of a DSP and a microprocessor, a combination of a plurality of microprocessors, a combination of one or more microprocessors combined with a DSP core, or a combination of any other such configurations.

Referring to FIG. 4A, the driving circuit unit 1000 may include a plurality of driving circuits, which may form M rows and N columns.

Referring to FIG. 4A, the driving circuit unit 1000 may include the active area 410 and the inactive area 420, and the inactive area 420 may include the inspection function implementation area 430.

Specifically, the last two rows of the driving circuit unit 1000, an $(M-1)^{th}$ row and an $M^{th}$ row, may form the inactive area 420. As shown in FIG. 4A, each of the $(M-1)^{th}$ row and the $M^{th}$ row may include N driving circuits.

As described above, the inactive area 420 according to the present disclosure may include the inspection function implementation area 430. In an embodiment, any one of the rows included in the inactive area 420 may be the inspection function implementation area 430. In the example shown in FIG. 4A, the $M^{th}$ row of the inactive area 420 may correspond to the inspection function implementation area 430. That is, in the example shown in FIG. 4A, the inspection function implementation area 430 may be utilized to implement the inspection function, and the driving circuit included in the inspection function implementation area 430 may not operate in the driving mode, but may operate in the inspection mode.

FIG. 4B is a diagram for describing the implementation of the inspection function in the inspection mode.

As described above, the driving circuit included in the inspection function implementation area 430 may not operate in the driving mode, but may operate in the inspection mode. When the driving circuit included in the inspection function implementation area 430 operates in the inspection mode, it may mean that a current flow may be formed through an electrical connection to the driving circuit to be inspected.

The driving circuit board according to the present disclosure may implement the inspection function by forming an electrical connection between a driving circuit to be inspected and the driving circuit included in the inspection function implementation area 430. As described above, setting a target to be inspected may be performed by the first controller 1010 and the second controller 1020.

In an embodiment, the first controller 1010 may select at least one of one or more rows as a row to be inspected. In an embodiment, the second controller 1020 may select at least some of the driving circuits included in the row to be inspected as an inspection target.

In the example shown in FIG. 4B, the second row may be selected as the row to be inspected, by the first controller 1010.

Specifically, the first controller 1010 may generate and supply a signal for selecting the second row, and an electrical connection between the driving circuits included in the second row and a corresponding test line may be formed by the supplied signal. In an embodiment, the driving circuit included in the active area may include a switch whose electrical connection to the corresponding test line is controllable, and the switch may be controlled by the first controller 1010.

Each test line may also be connected to the driving circuit included in the inspection function implementation area 430. Accordingly, each of the driving circuits included in the row to be inspected, selected by the first controller 1010, may form an electrical connection to the driving circuit of the corresponding inspection function implementation area 430.

Referring to the first column of FIG. 4B, it is shown that an electrical connection is generated between the driving circuit included in the second row and the driving circuit included in the inspection function implementation area 430 through a test line 401.

In the present disclosure, as the electrical connection is generated between the driving circuit included in the active area 410 and the driving circuit included in the inspection function implementation area 430, a test current may be generated, and by measuring the test current, whether or not the driving circuit included in the active area 410 operates normally, electrical characteristics of the driving circuit, etc., may be detected.

Specifically, as described above, the control signal switch of the driving circuit to be inspected may operate normally, and the electrical characteristics of the driving circuit to be inspected according to the operation of the control signal switch may be transmitted through the test line 401, and such electrical characteristics may be transmitted to the driving circuit included in the inspection function implementation area 430 and expressed as test current. As a result, the test current may feature an operation based on the control signal of the driving circuit to be inspected.

Meanwhile, in an embodiment, the second controller 1020 may selectively receive the test current. That is, the second controller 1020 may control to inspect whether some of the driving circuits included in the row to be inspected operate, which may be realized by receiving the test current for some of one or more columns. For example, the second controller 1020 may control an electrical connection between the driving circuit included in the inspection function implementation area 430 and the test line. Specifically, the driving circuit included in the inspection function implementation area 430 may include a switch whose electrical connection to the corresponding test line is controllable, and the switch may be controlled by the second controller 1020.

For example, if the purpose is only to measure "I_test 1", which is the test current for the first column, the second controller 1020 can generate and supply a signal to select the first column, and add a signal to the supplied signal. As a result, an electrical connection with the test line can be created only for the driving circuit of the inspection function implementation area 430 included in the first column.

Accordingly, in an embodiment, the driving circuit unit 1000 may include one or more test lines, and the number of one or more test lines may equal the number of columns included in the driving circuit unit 1000.

The example described above with reference to FIG. 4B relates to inspection of a driving circuit included in one row selected by the first controller 1010, that is, one of the driving circuits included in one column, but in an embodiment, a plurality of rows may be selected, such that operations of the plurality of driving circuits included in one column may be verified and current characteristics of the plurality of driving circuits may be identified.

Moreover, in the example described above with reference to FIG. 4B, the inspection function implementation area 430 includes one row, but the inspection function implementation area 430 may include one or more rows.

Figure 5:
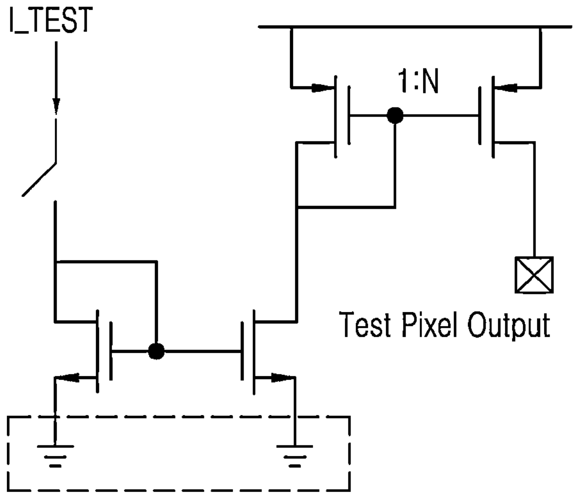
FIG. 5 shows a current amplifying circuit for amplifying test current according to an embodiment of the present disclosure.

FIG. 5 shows a current amplifying circuit for amplifying a test current according to an embodiment of the present disclosure.

Micro LEDs are quite small in size and generally operate with small current, such that when a small number (e.g., one) of driving circuits are inspected, the corresponding test current may have a very small value. That is, in the example shown in FIG. 4B, the test currents I_test 1, I_test 2, . . . , I_test N may have very small magnitudes. To compensate for this, in an embodiment, the driving circuit board may further include a current amplifying circuit.

Referring to FIG. 5, the current amplifying circuit may amplify the inputted test current I_test and output the test current to an output terminal Test Pixel Output.

In an embodiment, the current amplifying circuit may be disposed on a driving circuit board. Specifically, the current amplifying circuit may be electrically connected to a driving circuit included in an inspection function implementation area. For example, the current amplifying circuit may be arranged to be included in the driving circuit included in the inspection function implementation area. For example, the current amplifying circuit may be arranged to be included in the first controller or the second controller (in the example shown in FIG. 4B, the second controller) depending on the arrangement of the inspection function implementation area.

Hereinbelow, a specific process for controlling inspection of the driving circuit board according to the present disclosure will be described. The operation of controlling inspection of the driving circuit board according to the present disclosure may be performed by an inspection controller included in the driving circuit board. The inspection controller may control the inspection of a plurality of driving circuits in the inspection mode. The inspection controller according to the present disclosure may include the above-described first controller and second controller. The inspection controller according to the present disclosure may be substantially the same as the controller 121 described below, or may be implemented as a part of the controller 121 or as a separate component from the controller 121.

For example, the inspection controller may be implemented as at least one processor or at least one electrical circuit. The processor may be implemented as an array of a plurality of logic gates, or may be implemented as a combination of a general-purpose microprocessor and a memory storing a program executable by the microprocessor. For example, the processor may include a general-purpose processor, a central processing unit (CPU), a microprocessor, a digital signal processor (DSP), a controller, a microcontroller, a state machine, etc. In some environments, the processor may include an application-specific integrated circuit (ASIC), a programmable logic device (PLD), a field-programmable gate array (FPGA), etc. For example, processor may refer to a combination of processing devices, such as a combination of a DSP and a microprocessor, a combination of a plurality of microprocessors, a combination of one or more microprocessors combined with a DSP core, or a combination of any other such configurations.

The inspection process of the driving circuit board according to the present disclosure may include the first inspection and the second inspection.

In the present disclosure, the first inspection may include dividing the driving circuit array into one or more areas and inspecting an operation of a driving circuit on an area-by-area basis. In the present disclosure, the second inspection may include inspecting an operation of a driving circuit in a specific area based on a result of the first inspection. For example, the second inspection may include inspecting an operation of a driving circuit selected according to the first inspection.

In the present disclosure, the overall operation of the driving circuit array may be first inspected through the first inspection, and specific problems in the driving circuit may be detected through the second inspection. When an inspection method according to the present disclosure is adopted, the inspection time for the driving circuit board may be effectively reduced, and in particular, the effect may be improved as the number of driving circuits of the driving circuit board increases.

In an embodiment, depending on the result of the first inspection, it may be determined whether the second inspection is to be performed. For example, if the result of the first inspection may be evaluated according to three levels, it may be determined that the second inspection is to be performed when the result of the first inspection is an intermediate level. When the result of the first inspection is the lowest level, the manufactured driving circuit board may be regarded as unusable without a need to perform additional inspection, and when the result of the first inspection is the highest level, the manufactured driving circuit board may be regarded as an excellent product without being additionally inspected. However, the current embodiment is provided simply as an example, and a person practicing the present disclosure may be configured to determine whether or not to perform the second inspection in a random manner.

Figure 6:
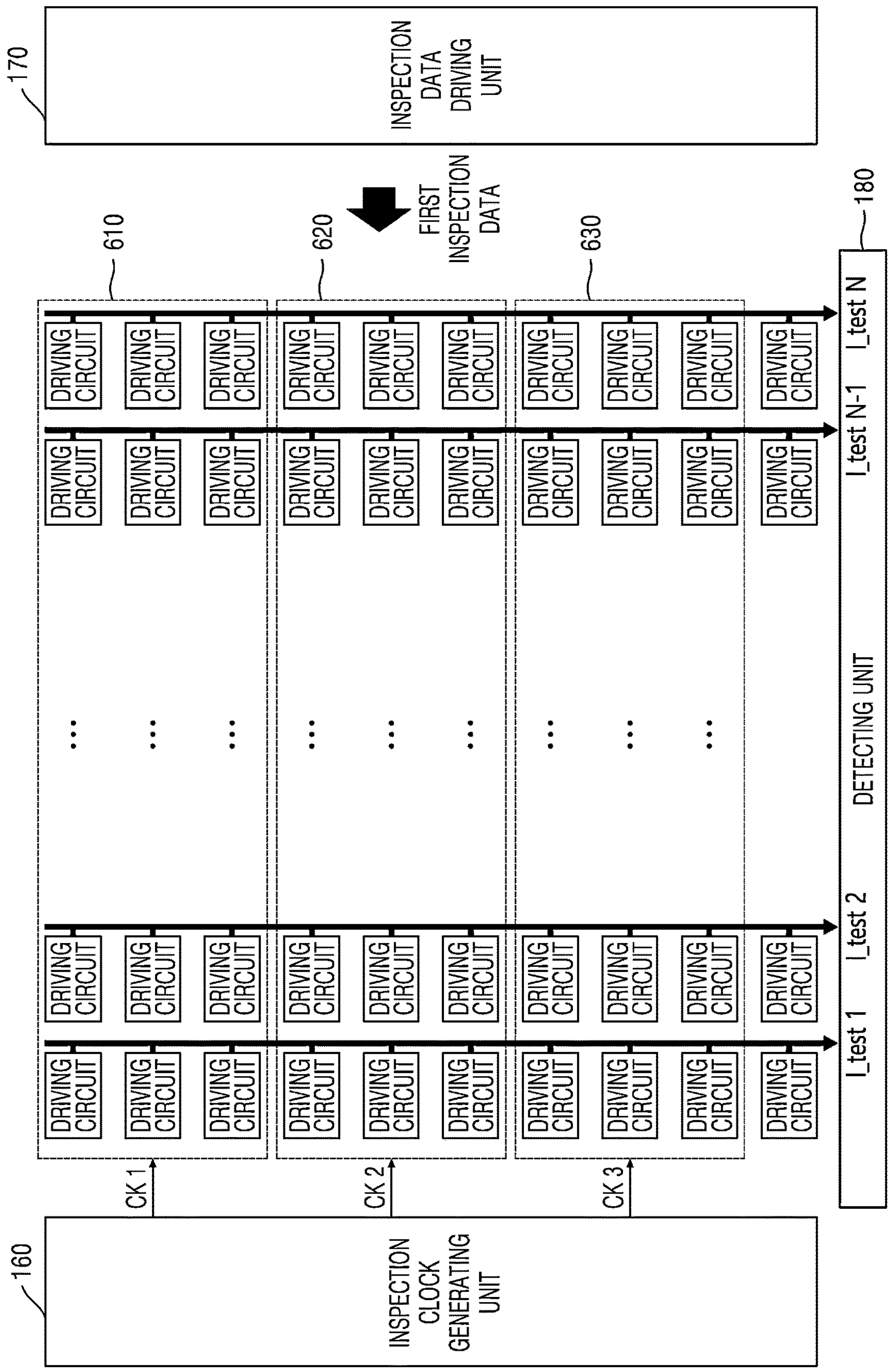
FIG. 6 is a diagram for describing a process for controlling the first inspection according to an embodiment of the present disclosure.

FIG. 6 is a diagram for describing a process for controlling the first inspection according to an embodiment of the present disclosure.

FIG. 6 shows a driving circuit array including 10 rows of driving circuits. For convenience of a description, a driving circuit array including 10 rows is shown, but it is obvious that an inspection process according to the present disclosure is applicable to a driving circuit array including a random number of rows.

The last row among the 10 rows shown in FIG. 6 may be the inactive area or the inspection function implementation area described above.

As described above, the first inspection may be dividing the driving circuit array into one or more areas and inspecting the operation of the driving circuit in units of one or more areas. In the present disclosure, an area set for the first inspection will be defined as a block.

In the present disclosure, the driving circuit array may form one or more rows, each including one or more driving circuits, and one or more columns, each including one or more driving circuits.

In an embodiment, the inspection controller may divide the driving circuit array into one or more blocks. In an embodiment, the inspection controller may divide the driving circuit array into one or more blocks based on a row or a column. Hereinafter, various embodiments of the present disclosure will be described based on that the inspection controller divides the driving circuit array into one or more blocks on a row-by-row basis, but it is obvious that the current description is also applicable to dividing, by the inspection controller, the driving circuit array into one or more blocks on a column-by-column basis.

When the inspection controller divides the driving circuit array into one or more blocks on a row basis, it may mean that when a first row is included in a first block generated by the division, all driving circuits included in the first row are included in the first block. That is, the first block generated on a row basis includes some of all rows, but may include driving circuits corresponding to all columns.

In an embodiment, the inspection controller may divide the driving circuit array such that each block includes one or more rows.

In an embodiment, the number of rows included in a block may be less than or equal to a threshold. That is, the inspection controller may divide the driving circuit array such that each of one or more blocks includes rows of a number less than or equal to the threshold.

In an embodiment, the threshold may equal a bit size of image data. The driving circuit according to the present disclosure, specifically, a memory included in the driving circuit, may store a bit value of the image data applied from the data driving unit, and the bit size of the image data that the driving circuit may store may be set as a threshold. That is, when the memory included in the driving circuit is an n-bit memory, the threshold may be n.

In the present disclosure, when the number of rows that each of one or more blocks may include is limited, it may enable a row having a problem occurring to be identified in the analysis of an inspection result. When the row having the problem occurring is identified, each driving circuit included in the identified row is included in a different column, such that the driving circuit having the problem occurring may also be identified.

Referring to FIG. 6, a first block 610, a second block 620, and a third block 630 are shown. Referring to FIG. 6, each block may include three rows. In the example of FIG. 6, the threshold, that is, the memory included in the driving circuit, may be a 3-bit memory.

In an embodiment, a clock signal for inspection (or an inspection clock signal) may be applied to each block. That is, in an embodiment, the inspection controller may control the inspection clock signal to be generated and input to each block.

In an embodiment, generating and inputting the inspection clock signal may be performed by an inspection clock generating unit 160. That is, the inspection controller may control the inspection clock generating unit 160 to generate the inspection clock signal. In an embodiment, the inspection clock generating unit 160 may be substantially the same as the clock generating unit 129 described later or may be implemented as a part of the clock generating unit 129 or as a separate component from the clock generating unit 129.

In an embodiment, in the first inspection, the inspection controller may control the clock generating unit 160 to apply the same clock signal to one block. That is, the same clock signal may be input to a driving circuit included in the same block.

Referring to FIG. 6, CK 1 may be input to a first block 610, CK 2 may be input to a second block 620, and CK 3 may be input to a third block 630.

When the same clock signal is applied to one block, the same data (e.g., first inspection data to be described later) may be input to driving circuits included in one block and included in the same column at the same time, and as a result value, the test current may be equally outputted.

In the present disclosure, based on the test current, a row in which a problem occurs may be identified.

In an embodiment, in a way to identify the row in which the problem occurs, a current outputted from each row included in one block may be controlled so as not to overlap in time. That is, the current output from each row included in one block may flow to a corresponding test line and may be measured as a test current, and by temporally separating the current output from each row included in one block, a row in which current is output abnormally may be identified through the test current. Temporally separating the current output from each row included in one block may be implemented by manipulating a timing for a clock signal input to each row, adding an additional test circuit for identifying output current in each row to a test line, manipulating test data for identifying the output current, modifying an order, or delaying output to the test line.

Specifically, a time in which current is output from one driving circuit in response to input data will be defined as a current output time. In an embodiment, as data is input row-by-row, the time in which the current is output from one row in response to the input data may be the same as the current output time. In the present disclosure, the size of input data may be proportional to the size of the memory or the bit size of the image data. Thus, the current output time may be proportional to the size of the memory or the bit size of the image data.

In an embodiment, a delay time may be provided between the current outputted from one row and the current outputted from an adjacent row. In an embodiment, the delay time may be greater than or equal to the current output time. This may be intended to temporally separate current output from each row from the test current. That is, as the size of the memory or the bit size of the image data increases, the current output time in which the current is output from one row increases, increasing the delay time.

As a specific example, I_test 1, which is the test current corresponding to the first column in FIG. 6, will be described as an example.

For example, when the current output time in which the current is outputted from one driving circuit in response to first inspection data, i.e., in the example of FIG. 6, the current output time in which the current is output in response to 3-bit data is $\Delta t1$, a delay time is $\Delta t2$, and I_test 1 corresponding to the second block 620 is output from T, in a current-time graph of I_test 1, a part corresponding to the first row included in the second block 620, may be from T to $T+\Delta t1$, a part corresponding to the second row included in the second block 620 may be from $T+\Delta t2$ to $T+\Delta t2+\Delta t1$, and a part corresponding to the third row included in the second block 620 may be from $T+2\Delta t2$ to $T+2\Delta t2+\Delta t1$. In an embodiment, the delay time $\Delta t2$ may be greater than the current output time $\Delta t1$, and in this case, in the current-time graph of I_test_1, a part corresponding to each row may not overlap with each other and may be separated in time.

Meanwhile, for example, when the current output time and delay time are the same as $\Delta t$, and I_test 1 corresponding to the second block 620 starts to be output from T, then, in the current-time graph of I_test 1, the part corresponding to the first row included in the second block 620 may be from T to $T+\Delta t$, the part corresponding to the second row included in the second block 620 may be from $T+\Delta t$ to $T+2\Delta t$, and the part corresponding to the third row included in the second block 620 may be from $T+2\Delta t$ to $T+3\Delta t$. Accordingly, in this example, a total time allocated to the second block 620 in the first inspection may be from T to $T+3\Delta t$, and a time allocated to the third block 630 may be after $T+3\Delta t$.

In another embodiment, in a way to identify a row in which a problem occurs, manipulation on the input first inspection data (described below) may be performed. That is, each row included in one block may be configured to receive individual data as input and to output current, and the individual data may be generated by manipulating the first inspection data. For example, when one block includes three rows, a total of three types of individual data may be generated through manipulation of the first inspection data.

In an embodiment, the individual data input to each row included in one block may include a valid section and an invalid section, in which the valid section may correspond to the first inspection data and the invalid section may be a part that does not serve as data. The invalid section may be understood as a kind of pseudo section. The invalid section may be generated such that the current output corresponding to the invalid section does not affect a result of the first inspection. In an embodiment, the valid section of individual data input to each row included in one block may be generated so as not to overlap in time.

In a specific way, in an embodiment, the manipulation of the first inspection data may include processing the first inspection data generated by an inspection data driving unit (described later) and inputting the same to each row included in one block. In the current embodiment, a component for processing the first inspection data may be included in the data driving unit or may be provided separately from the data driving unit.

In addition to the methods described above, any suitable method may be applied to identify a row in which a problem occurs.

Meanwhile, in an embodiment, a time allocated to one row in the driving mode may be the same as a time allocated to one block in the inspection mode. That is, a time required for one row to operate and output current in the driving mode may be the same as a time required for one block to operate and output current in the inspection mode. According to the current embodiment, as the inspection clock signal, the clock signal used in the driving mode may be equally used.

In another embodiment, the time allocated to one block in the inspection mode may be greater than the time allocated to one row in the driving mode. When the bit size of image data increases, the time corresponding to one bit may be too short to make it difficult to obtain an appropriate inspection result. To overcome this situation, the time allocated to one block in inspection mode may be longer than the time allocated to one row in driving mode. According to the current embodiment, the inspection clock signal and the clock signal used in the driving mode may be different from each other.

In an embodiment, for the first inspection, first inspection data may be input. That is, in an embodiment, the inspection controller may control the first inspection data to be generated and input into each block.

In an embodiment, generating and inputting the first inspection data may be performed by the inspection data driving unit 170. That is, the inspection controller may control the inspection data driving unit 170 to generate the first inspection data. In an embodiment, the inspection data driving unit 170 may be substantially the same as the data driving unit 125, described later, or may be implemented as a part of the data driving unit 125 or as a separate component from the data driving unit 125.

In an embodiment, all bit values of the first inspection data may be high. In the example of FIG. 6, as the memory included in the driving circuit is a 3-bit memory, the first inspection data may be (1, 1, 1).

In an embodiment, all bit values of the first inspection data may be low. In the example of FIG. 6, as the memory included in the driving circuit is a 3-bit memory, the first inspection data may be (0, 0, 0).

In an embodiment, the first inspection data may be a data set including a plurality of data. In an embodiment, the first inspection data may be a data set including data with bit values being all high and data with bit values being all low. In the example of FIG. 6, the first inspection data may be {(1, 1, 1), (0, 0, 0)}.

In an embodiment, a driving circuit may output current in response to the input first inspection data, and the current output by the driving circuit may be detected as a test current.

In an embodiment, the test current may be detected by the detecting unit 180. The detecting unit 180 may detect current output from a plurality of driving circuits. In an embodiment, the detecting unit 180 may correspond to the second controller 1022 described above.

In an embodiment, the detecting unit 180 may individually detect a test current corresponding to each of one or more rows. In the present disclosure, the test current for the first inspection may correspond to the result of the first inspection. The operation of the detecting unit 180 may be controlled by the inspection controller.

In an embodiment, the detecting unit 180 may generate a result of the first inspection based on the detected test current. For example, the detecting unit 180 may generate the result of the first inspection based on preset logic. The result of the first inspection may include whether the test current is normal, a section in which abnormal test current occurs, a driving circuit (e.g., a row) corresponding to the section in which the abnormal test current occurs, etc.

In an embodiment in which all bit values of the first inspection data are high, when the driving circuit operates normally, the test current should have a value corresponding to a bit value that is high over all sections of the test current, such that when the specific driving circuit does not operate normally, the test current may have a value other than the value corresponding to the high bit value for some sections of the test current. Depending on a section of the test current according to the present disclosure, a corresponding driving circuit (a row in the embodiment of FIG. 6) is different, such that when there is a value other than the value corresponding to the high bit value in some sections of the test current, a driving circuit having a problem may be identified.

In an embodiment, the detecting unit 180 may generate a signal corresponding to the result of the first inspection. In an embodiment, a signal corresponding to the result of the first inspection may be transmitted to the inspection controller.

In an embodiment, the detecting unit 180 may include a terminal to which a test probe may be connected. A user may directly check the current characteristics through the terminal to which the test probe may be connected.

In an embodiment, the inspection controller may select an additional inspection driving circuit based on the results of the first inspection. That is, the inspection controller may select an additional inspection driving circuit based on the test current detected by the detecting unit 180. As described above, as the result of the first inspection may include a driving circuit corresponding to a section in which an abnormal test current occurs, the inspection controller may select the additional inspection driving circuit. In an embodiment, the inspection controller may select the additional inspection driving circuit based on a signal corresponding to the result of the first inspection, generated by the detecting unit 180.

According to the embodiments related to the first inspection described above, the time required for inspection may be significantly reduced compared to a general inspection method that performs inspection on all driving circuits. Specifically, as the size of the memory (bit size of image data) increases, the time required according to the general inspection method that performs inspection on all driving circuits increases in proportion to the size of the memory, but the required time for the first inspection according to the inspection method may not increase. Accordingly, the larger the size of the memory included in the driving circuit, the more effective the inspection method corresponding to the first inspection according to the present disclosure may be.

Figure 7:
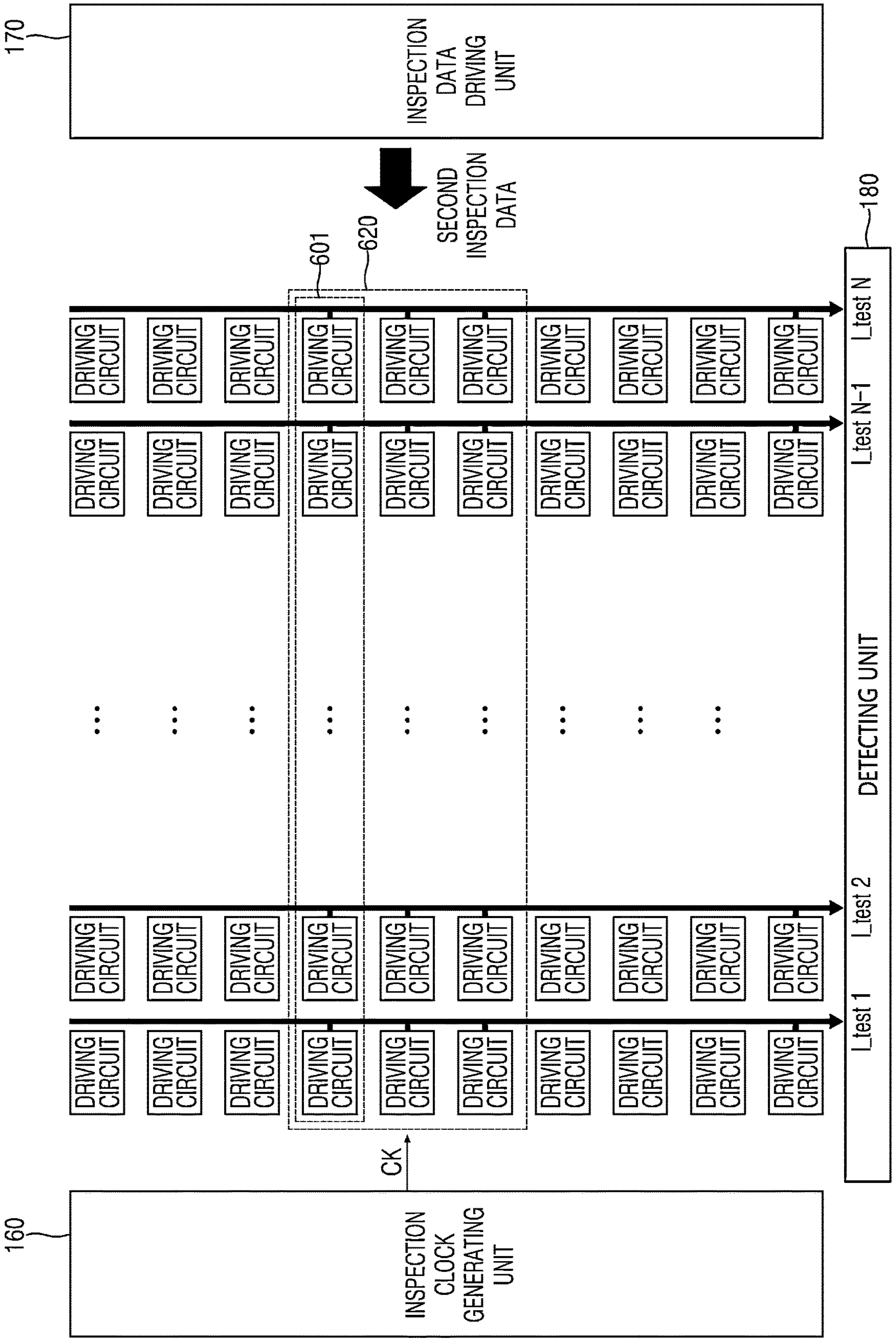
FIG. 7 is a diagram for describing a process for controlling the second inspection according to an embodiment of the present disclosure.

FIG. 7 is a diagram for describing a process for controlling the second inspection according to an embodiment of the present disclosure.

In an embodiment, the inspection controller may control second inspection to inspect the operation of the additional inspection driving circuit.

In an embodiment, the second inspection may be inspection for identifying a problematic part of the driving circuit. Through the second inspection, a part that causes abnormal current output of the driving circuit may be identified.

The driving circuit according to the present disclosure may largely include a circuit that receives current from a current source (hereinafter referred to as a "driving current circuit") and a circuit that stores input data in a memory and controls the flow of current based on the data stored in the memory (hereinafter referred to as a "memory circuit"). Therefore, when the driving circuit outputs current abnormally, there may be a problem in the driving current circuit or the memory circuit. In the present disclosure, the second inspection may determine whether there is abnormality in the driving current circuit or the memory circuit in the driving circuit (e.g., the additional inspection driving circuit).

Similar to FIG. 6, FIG. 7 shows a driving circuit array including 10 rows of driving circuits. A detailed description of the components shown in FIG. 7 that are the same as those shown in FIG. 6 will be omitted.

Referring to FIG. 7, the second block 620 and a target row 601 included in the second block 620 are shown. In the present disclosure, the target row 601 may refer to a row including the additional inspection driving circuit.

In an embodiment, the inspection controller may control the second inspection for the target row 601.

As described above, the inspection controller may select the additional inspection driving circuit based on the detection of the detecting unit 180, and as the signal is input by the inspection clock generating unit 160 row-by-row, the inspection controller may control the second inspection on the target row 601 that is the row including the additional inspection driving circuit, thereby controlling inspection on the operation of the additional inspection driving circuit. In other words, the inspection controller may control the second inspection on for the target row 601, but may actually control the second inspection on the additional inspection driving circuit.

In the example of FIG. 7, it may be determined that the driving circuit included in the first row of the second block 620 outputs the abnormal test current according to the result of the first inspection.

In FIG. 7, one target row 601 is shown, but when one or more additional inspection driving circuits are selected and included in different rows, there may be one or more target rows 601.

In an embodiment, an inspection clock signal may be generated by the inspection clock generating unit 160. In an embodiment, the inspection clock signal may be input to a block determined as outputting the abnormal test current, for example, the second block 620 of FIG. 7. In an embodiment, the clock signal input to the block determined as outputting the abnormal test current may be the same as a case with the first inspection. In another embodiment, unlike in the first inspection, in the second inspection, the inspection controller may control the inspection clock generating unit 160 to apply a clock signal to the target row 601 including the additional inspection driving circuit. In another embodiment, when the clock signal is applied only to the target row 601 on which the second inspection is performed, the time required to inspect one row may be longer or shorter than the time required to inspect one row in the first inspection, regardless of the time required for inspection of the one row in the first inspection.

In the present disclosure, the description of the embodiment of the time allocated to one block in the first inspection may be inferred and applied to the second inspection. For example, in the second inspection, the time allocated to one row (i.e., the target row) in the inspection mode may be the same as the time allocated to one row in the driving mode.

In an embodiment, for the second inspection, the second inspection data may be input. In an embodiment, the inspection controller may control the second inspection data to be generated and input into the target row 601. In another embodiment, the inspection controller may control the second inspection data to be generated and input to the additional inspection driving circuit included in the target row 601.

In an embodiment, generating and inputting the second inspection data may be performed by the inspection data driving unit 170.

In an embodiment, the second inspection data may be a data set including a plurality of data. The second inspection data may be configured to verify the operation of each memory cell included in the driving circuit. That is, the second inspection data may include data for verifying a fault occurring in memory cells included in the driving circuit. For example, a fault occurring in a memory cell may include a stuck fault in the memory cell.

In an embodiment, the second inspection data be configured to verify a fault (stuck at 0 fault) in which a memory cell included in a driving circuit is stuck at a low level and a fault (stuck at 1 fault) in which the memory included in the driving circuit is stuck at a high level. In the present disclosure, for the second inspection, an SA0 verification data set may refer to a data set that verifies a fault in which the memory cell included in the driving circuit is stuck at the low level, and an SA1 verification data set may refer to a data set that verifies a fault in the memory cell included in the driving circuit is stuck at the high level.

In an embodiment, the SA0 verification data set may be a data set in which data is configured for each memory cell such that high data is input to any one of all memory cells and low data is input to the other memory cells. That is, the SA0 verification data set may be configured by configuring, for each bit, data in which any one of the bits corresponding to respective memory cells has a high value and the remaining bits have a low value.

For example, in the example of FIG. 7, that is, an example in which the memory included in the driving circuit is a 3-bit memory, the SA0 verification data set may be {(1, 0, 0), (0, 1, 0), (0, 0, 1)}.

In an embodiment, the SA1 verification data set may be a data set in which data is configured for each memory cell such that low data is input to any one of all memory cells and high data is input to the other memory cells. That is, the SA0 verification data set may be configured by configuring, for each bit, data in which any one of the bits corresponding to respective memory cells has a low value and the remaining bits have a high value.

For example, in the example of FIG. 7, that is, an example in which the memory included in the driving circuit is a 3-bit memory, the SA0 verification data set may be {(0, 1, 1), (1, 0, 1), (1, 1, 0)}.

In the present disclosure, it may be determined whether data is normally input to the memory included in the driving circuit based on the second inspection data, and in this way, it may be determined whether there is abnormality in the driving current circuit or the memory circuit in the driving circuit.

In an embodiment, a driving circuit may output current in response to the input second inspection data, and the current output by the driving circuit may be detected as a test current. In an embodiment, the test current may be detected by the detecting unit 180.

In an embodiment, the detecting unit 180 may generate a result of the second inspection based on the detected test current.

As described above, the present disclosure may separately implement the first inspection and the second inspection, thereby sequentially performing the first inspection and the second inspection. In other words, the process of quickly inspecting the entire driving circuit through area division and the process of inspecting the driving circuit requiring additional inspection in detail are separately provided, such that efficient inspection of the driving circuit board or display apparatus may be performed.

Figure 8:
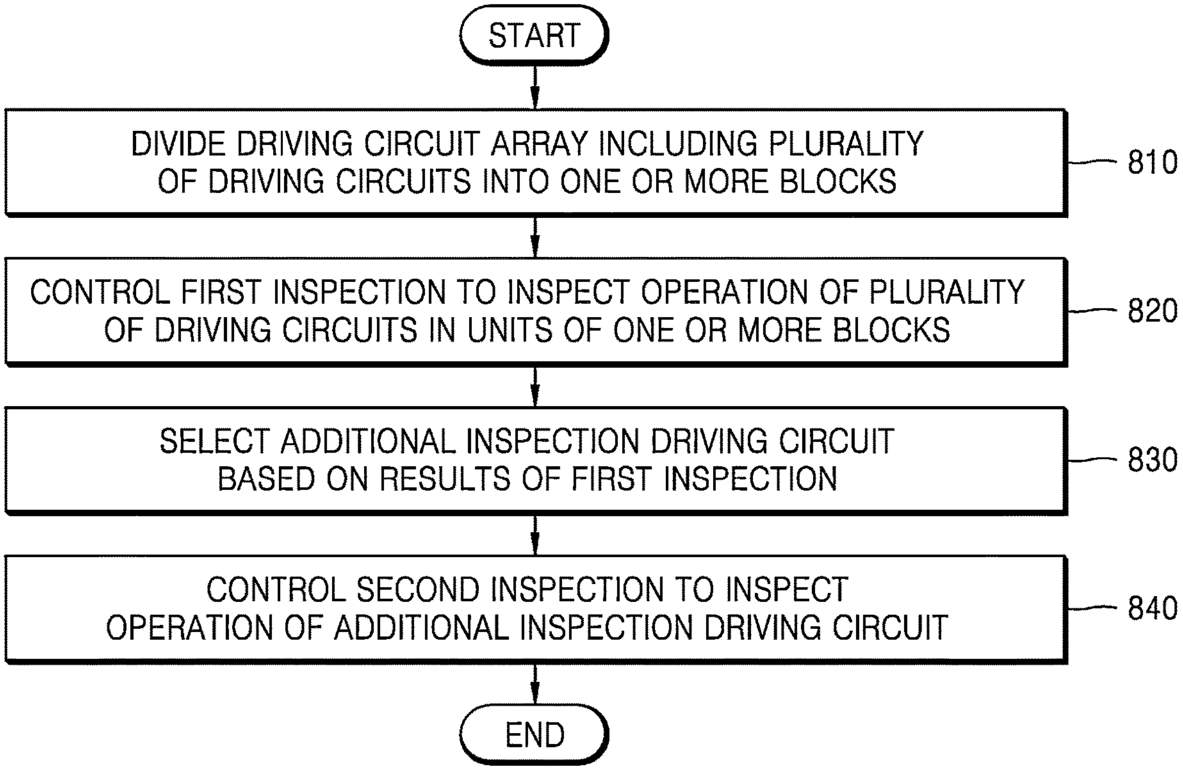
FIG. 8 is a flowchart of a method for controlling the inspection of a driving circuit board having an inspection function according to an embodiment of the present disclosure.

FIG. 8 is a flowchart of a method for controlling inspection of a driving circuit board having an inspection function according to an embodiment of the present disclosure.

The operations shown in FIG. 8 may be performed by the inspection controller described above. Matters overlapping with the above-description for each of the operations shown in FIG. 8 will be omitted.

In operation 810, the inspection controller may divide a driving circuit array including a plurality of driving circuits into one or more blocks.

In operation 820, the inspection controller may control first inspection to inspect operations of the plurality of driving circuits in units of one or more blocks.

In operation 830, the inspection controller may select an additional inspection driving circuit based on the results of the first inspection.

In operation 840, the inspection controller may control second inspection to inspect the operation of the additional inspection driving circuit.

Figure 9:
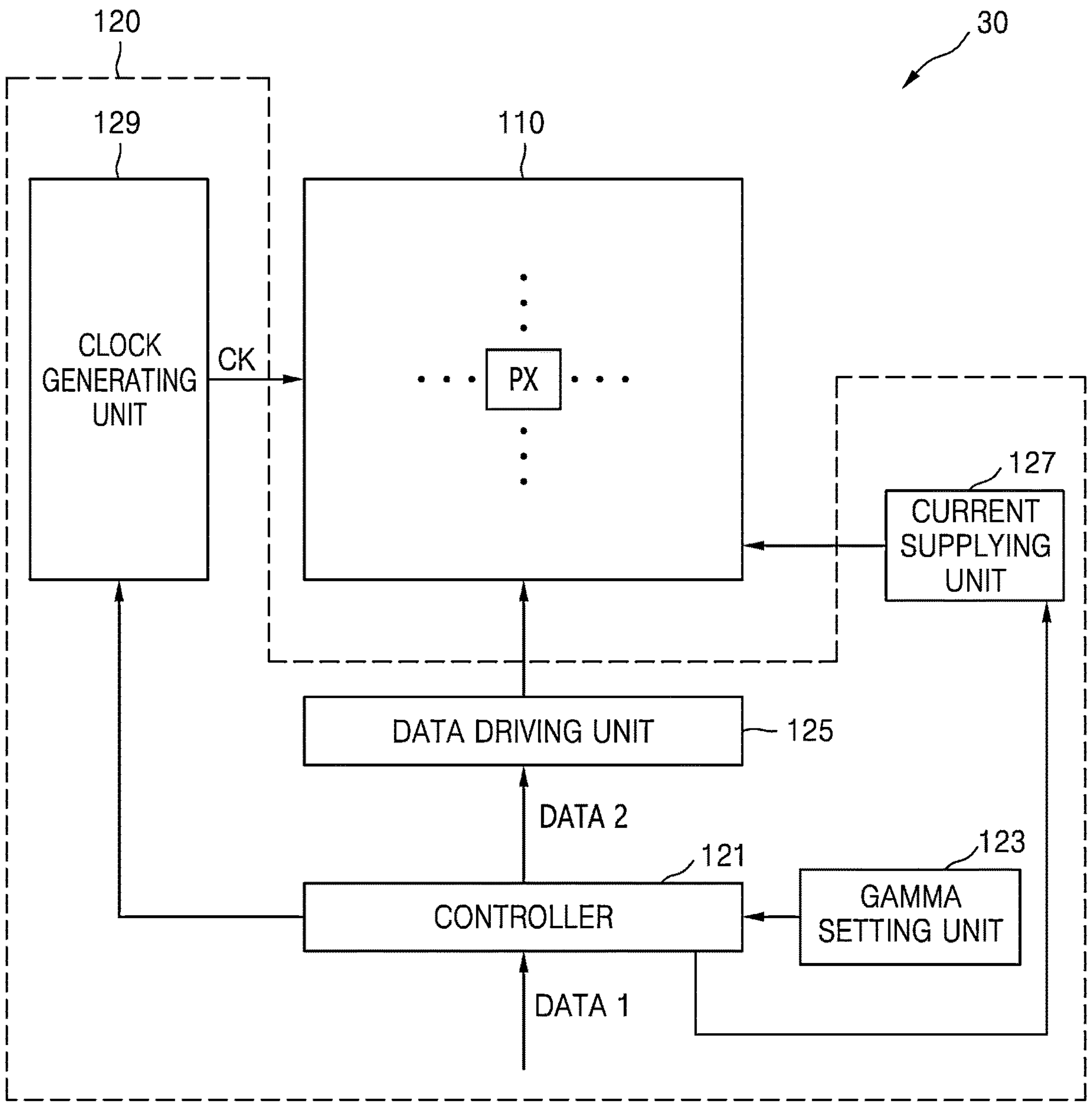
FIG. 9 is a diagram schematically showing a display apparatus according to an embodiment of the present disclosure.

FIG. 9 is a diagram schematically showing a display apparatus according to an embodiment of the present disclosure.

FIG. 9 may be a diagram illustrating the display apparatus shown in FIG. 2 in more detail. Thus, the matters mentioned in FIG. 2 are omitted.

As described above, the display apparatus 30 may be manufactured by coupling the light-emitting device array 10 to the driving circuit board 20.

Thus, the display apparatus 30 may further include the above-described components according to various embodiments of the present disclosure, in addition to the components shown in FIG. 9. The components shown in FIG. 9 may be components that mainly operate in the driving mode.

In an embodiment, the driving unit 120 may include the controller 121, a gamma setting unit 123, the data driving unit 125, a current supplying unit 127, and the clock generating unit 129.

In an embodiment, the controller 121 may receive image data of one frame from an external source (e.g., a graphics controller), extract a grayscale for each pixel PX, and convert the extracted grayscale into digital data of a predetermined number of bits.

In an embodiment, the controller 121 may receive a correction value from the gamma setting unit 123 and perform gamma correction on input image data DATA1 using the correction value, thus generating corrected image data DATA2. The controller 121 may output the corrected image data DATA2 to the data driving unit 125. The controller 121 may output the most significant bit (MSB) to the least significant bit (LSB) of the corrected image data DATA2 to the data driving unit 125 in a predetermined order.

In an embodiment, the gamma setting unit 123 may set the gamma value using a gamma curve, set the correction value of the image data according to the set gamma value, and output the set correction value to the controller 121. The gamma setting unit 123 may be provided as a separate circuit from the controller 121 or may be included in the controller 121.

In an embodiment, the data driving unit 125 may transmit the corrected image data DATA2 from the controller 121 to each pixel PX of the pixel unit 110. The data driving unit 125 may provide a bit value included in the corrected image data DATA2 to each pixel PX for each frame. The bit value may have either a first logic level or a second logic level. The first logic level and the second logic level may be a high level and a low level, respectively. Alternatively, the first logic level and the second logic level may be a low level and a high level, respectively.

In an embodiment, one frame may include a plurality of sub-frames. The length of each subframe may be different. For example, the length of the subframe corresponding to the MSB of the corrected image data DATA2 may be set to be the longest, and the length of the subframe corresponding to the LSB may be set to be the shortest. The order of the MSB to the LSB of the corrected image data DATA2 may correspond to the order of the first subframe to an $n^{th}$ subframe, respectively. The order of expression of subframes may be set differently by a designer.

In an embodiment, the data driving unit 125 may include a line buffer and a shift register circuit. The line buffer may be a 1-line buffer or a 2-line buffer. The data driving unit 125 may provide image data of a specific bit to each pixel on a line-by-line (row-by-row) basis.

As described above, the second controller 1022 according to the present disclosure may correspond to the data driving unit 125. Therefore, depending on a design method, in an embodiment, the data driving unit 125 may further include a current amplifying circuit.

In an embodiment, the current supplying unit 127 may generate and supply driving current to each pixel PX.

In an embodiment, the clock generating unit 129 may generate a clock signal for each subframe during one frame and output the clock signal to the pixels PX. The length of the clock signal may be the same as the length of the corresponding subframe. The clock generating unit 129 may sequentially supply a clock signal to a clock line for each subframe. The clock generating unit 129 may generate a clock signal according to a predetermined sub-frame order. For example, when the order of expression of four subframes is 1-2-3-4, the clock generating unit 129 may sequentially output a first clock signal to a fourth clock signal in the order of the first subframe to the fourth subframe. When the output order of the four subframes is 1-3-2-4, the clock generating unit 129 may sequentially output a first clock signal, a third clock signal, a second clock signal, and a fourth clock signal in the order of the first subframe, the third subframe, the second subframe, and the fourth subframe. Meanwhile, the clock signal may include a control signal (Sense), a control signal (SPWM), and a control signal (SPAM).

As described above, the first controller 1010 according to the present disclosure may correspond to the clock generating unit 129. Therefore, depending on a design method, in an embodiment, the clock generating unit 129 may further include a current amplifying circuit.

Each component of the driving unit 120 may be formed in the form of a separate integrated circuit chip or a single integrated circuit chip and may be mounted directly on a board on which the pixel unit 110 is formed, may be mounted on a flexible printed circuit film, may be attached to the board in the form of a tape carrier package (TCP), or may be directly formed on the board. In an embodiment, some of the controller 121, the gamma setting unit 123, the data driving unit 125, the current supplying unit 127, and the clock generating unit 129 may be connected to the pixel unit 110 in the form of an integrated circuit chip and some of them may be formed directly on the board.

Figure 10:
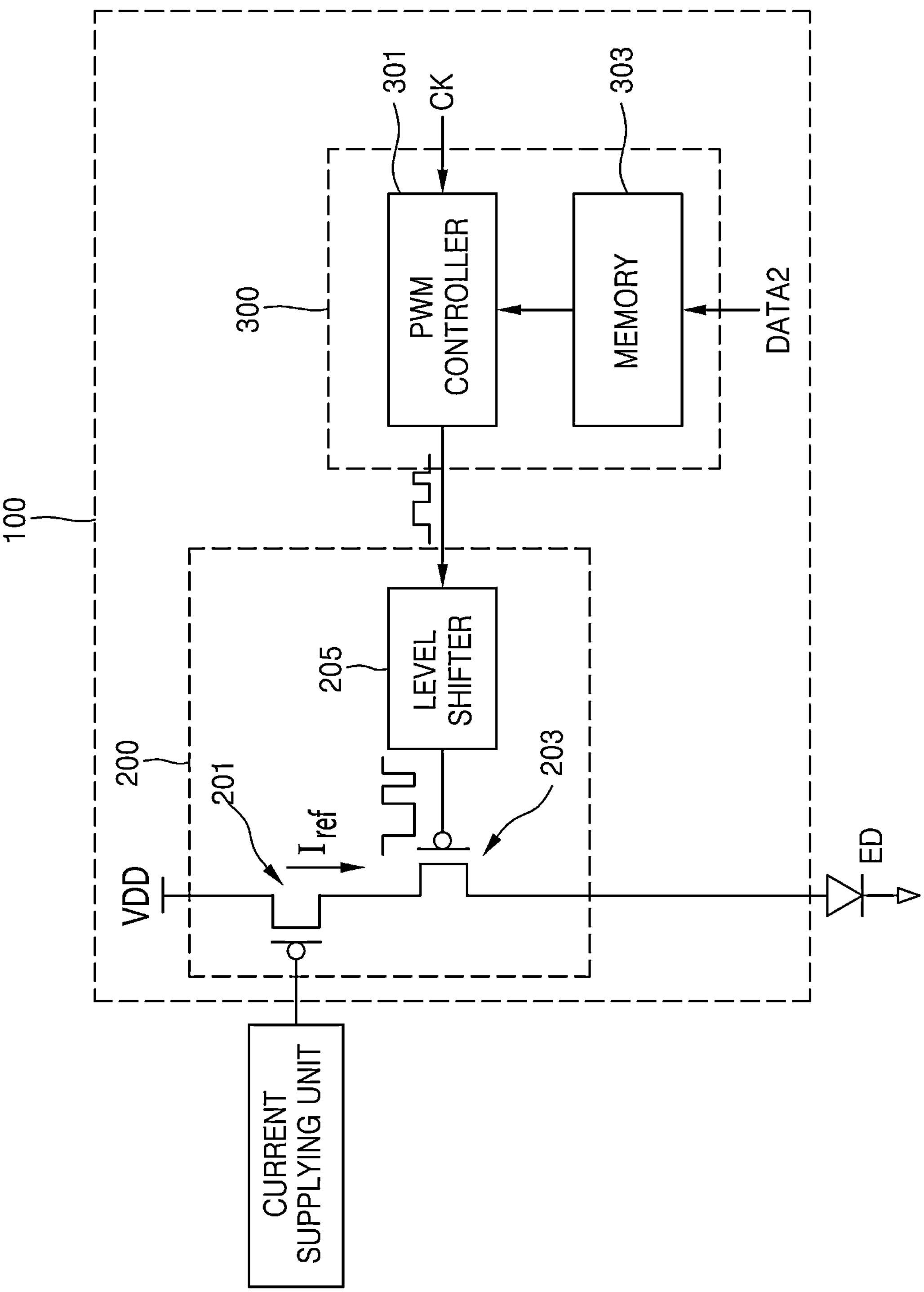
FIG. 10 is a circuit diagram showing a pixel PX according to an embodiment of the present disclosure.

FIG. 10 is a circuit diagram showing a pixel PX according to an embodiment of the present disclosure.

Referring to FIG. 10, the pixel PX may include a light-emitting device ED and the driving circuit 100 connected thereto. The driving circuit 100 of FIG. 10 may be a driving circuit included in the driving circuit board according to the various embodiments described above.

In an embodiment, the driving circuit 100 may include a first driving circuit 200 and a second driving circuit 300. The first driving circuit 200 may be a high-voltage driving circuit, and the second driving circuit 300 may be a low-voltage driving circuit. The second driving circuit 300 may be implemented with a plurality of logic circuits.

The light-emitting device ED may selectively emit light for each subframe based on a bit value (logic level) of image data provided from the data driving unit (e.g., the data driving unit 125 in FIG. 9) during one frame, thereby adjust a light-emission time in one frame and displaying gray-scales.

The first driving circuit 200 may control light emission or non-light emission of the light-emitting device ED in response to a control signal applied to each of the plurality of subframes during one frame. The control signal may be a pulse width modulation (PWM) signal. The first driving circuit 200 may include a first transistor 201, a second transistor 203, and a level shifter 205 that are electrically connected to a current supplying unit (e.g., the current supplying unit 127 in FIG. 9).

The first transistor 201 may output driving current. The first transistor 201 may include a gate connected to the current supplying unit, a first terminal connected to a power supply voltage (VDD) source, and a second terminal connected to the first terminal of the second transistor 203.

The second transistor 203 may transmit or block the driving current to the light-emitting device ED according to the PWM signal. The second transistor 203 may include a gate connected to an output stage of the level shifter 205, a first terminal connected to a second terminal of the first transistor 201, and a second terminal connected to the light-emitting device ED. Meanwhile, in an embodiment, the second transistor 203 may correspond to the control signal switch described above.

The second transistor 203 may be turned on or off depending on a voltage output from the level shifter 205. The light-emission time of the light-emitting device ED may be controlled according to the turn-on or turn-off time of the second transistor 203. When a gate-on level signal is applied to the gate, the second transistor 203 may be turned on to transmit the driving current output by the first transistor 201 to the light-emitting device ED, causing the ED to emit light. When a gate-off level signal is applied to the gate, the second transistor 203 may be turned off to block transmission of the driving current output by the first transistor 201 to the light-emitting device ED, causing the ED not to emit light. The light-emission time and non-light emission time of the light-emitting device ED are controlled by the turn-on time and turn-off time of the second transistor 203 during one frame, such that color depth may be expressed.

The level shifter 205 may be connected to an output stage of a PWM controller 301 of the second driving circuit 300 and convert a voltage level of a first PWM signal output by the PWM controller 301 to generate a second PWM signal. The level shifter 205 may generate the second PWM signal for converting the first PWM signal into a gate-on voltage level signal capable of turning on the second transistor 203 and a gate-off level signal capable of turning off the second transistor 203.

The pulse voltage level of the second PWM signal output by the level shifter 205 may be higher than the pulse voltage level of the first PWM signal, and the level shifter 205 may include a boosting circuit that boosts the input voltage. The level shifter 205 may be implemented with a plurality of transistors.

The turn-on time and turn-off time of the second transistor 203 for one frame may be determined according to the pulse width of the first PWM signal.

The second driving circuit 300 may store the bit value of the image data applied from the data driving unit during a data write period for each frame and generate the first PWM signal based on the bit value and the clock signal during a light-emitting period. The second driving circuit 300 may include the PWM controller 301 and a memory 303.

The PWM controller 301 may generate the first PWM signal based on the clock signal CK input from the clock generating unit (e.g., the clock generating unit 129 of FIG. 9) and the bit value of the image data read from the memory 303. When the clock signal in subframe units is input from the clock generating unit, the PWM controller 301 may read the corresponding image data bit value from the memory 303 and generate the first PWM signal.

The PWM controller 301 may control the pulse width of the first PWM signal based on the bit value of the image data in subframe units and the signal width of the clock signal. For example, when the bit value of the image data is 1, the pulse output of the PWM signal may be turned on by the signal width of the clock signal, and when the bit value of the image data is 0, the pulse output of the PWM signal may be turned off by the signal width of the clock signal. That is, the on time and off time of the pulse output of the PWM signal may be determined by the signal width (signal length) of the clock signal. The PWM controller 301 may include one or more logic circuits (e.g., OR gate circuits, etc.) implemented with one or more transistors.

In synchronization with a frame start signal, the memory 303 may receive n-bit corrected image data DATA2 applied through a data line from the data driving unit during the data writing period and store the same in advance. For a still image, image data previously stored in the memory 303 may be continuously used to display an image for a plurality of frames until the image is updated or refreshed.

Bit values (logic levels) from the MSB) to the LSB of the n-bit corrected image data DATA2 may be input to the memory 303 from the data driving unit in a predetermined order. The memory 303 may store data of at least 1 bit. In an embodiment, the memory 303 may be an n-bit memory. The bit values from the MSB to the LSB of the corrected image data DATA2 may be recorded in the memory 303 during the data writing period of the frame. In another embodiment, the memory 303 may be implemented as a memory of bits less than n, depending on the driving frequency. The memory 303 may be implemented with one or more transistors. The memory 303 may be implemented as random access memory (RAM), for example, a static RAM (SRAM) or dynamic RAM (DRAM).

In the embodiment of FIG. 10, the current supplying unit may be connected to one pixel PX, but the current supplying unit may be shared by a plurality of pixels PX.

In the above-described embodiment, an example in which the pixel includes P-type transistors is shown, but the embodiment of the present disclosure is not limited to thereto, and the pixel may include N-type transistors, and in this case, the pixel may be driven by a signal having an inverted level of a signal applied to P-type transistors.

At least some of the components according to the various embodiments described above may include processors, application-specific integrated circuits (ASICs), other chip-sets, logic circuits, registers, communication modems, data processors, etc., known in the art to execute the various control logics described above. In addition, when the above-described control logic is implemented as software, it may be implemented as a set of program modules. In this case, the program module may be stored in a memory device and executed by a processor.

A program may include a code encoded as a computer language such as C/C++, C#, JAVA, Python, a machine language, etc., that may be read by a processor (CPU) of a computer through a device interface of the computer in order for the computer to read the program and execute methods implemented with the program. Such code may include functional code related to a function that defines necessary functions for executing the methods, and may include control code related to an execution procedure necessary for the processor of the computer to execute the functions according to a predetermined procedure. In addition, such code may further include memory reference-related code that indicate a position (address) at which additional information or media required for execution of the functions by the computer's processor is to be referred to in an internal or external memory of the computer. Moreover, when communication with another computer, a server, etc., located remotely is required for execution of the functions by the computer's processor, the code may further include communication-related code regarding how to communicate with the other computer, the server, etc., located remotely using a communication module of the computer, which information or media is to be transmitted in communication, etc.

A storage medium in which a program is stored may not be a medium that stores data for a short period of time, such as a register or cache memory, but may be a medium that stores data semi-permanently and may be read by a device. Specifically, examples of the storage medium may include, but not limited to, read-only memory (ROM), RAM, compact disc (CD)-ROM, magnetic tape, floppy disk, optical data storage devices, etc. That is, the program may be stored in various recording media on various servers that the computer may access or in various recording media on the user's computer. Moreover, the storage medium may be distributed over computer systems connected through a network to store and execute a computer-readable code in a distributed manner.

It would be understood by those of ordinary skill in the art that the present disclosure may be implemented in a modified form within a scope without departing from the essential characteristics of the present disclosure. Thus, the spirit of the present disclosure should not be determined by being limited to the above-described embodiments, and not only the claims set forth below, but also any range equivalent to or equivalently changed from the claims falls within the scope of the spirit of the present disclosure.

According to various embodiments of the present disclosure, it may be inspected whether the driving circuit board is manufactured correctly even before coupling with the light-emitting device array.

In addition, according to various embodiments of the present disclosure, not only the entire driving circuit board but also each driving circuit may be inspected, and even current characteristics as well as normal operation may be identified.

Furthermore, various embodiments of the present disclosure may be effective and economical because the inspection function is implemented using the driving circuit included in the inactive area.

Moreover, the process of quickly inspecting the entire driving circuit through area division and the process of inspecting the driving circuit requiring additional inspection in detail are separately provided, such that efficient inspection of the driving circuit board or display apparatus may be performed.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A driving circuit board comprising:

a driving circuit array comprising a plurality of driving circuits; and at least one processor configured to control inspections on the plurality of driving circuits in an inspection mode, wherein the at least one processor is further configured to:

divide the driving circuit array into two or more blocks;

perform a first inspection to inspect operations of each of the two or more blocks sequentially to identify which one of the two or more blocks causes an error, each block comprising at least two columns or rows of the driving circuits;

identify at least one column or row of the identified block causing the error, based on a result of the first inspection; and perform a second inspection to inspect operations of driving circuits in the identified at least one column or row to identify which driving circuit in the identified at least one column or row causes the error.

2. The driving circuit board of claim 1, wherein the driving circuit array comprises an active area associated with light emission and non-light emission of a light-emitting device in a driving mode and an inactive area not associated with light emission and non-light emission of the light emitting device in the driving mode.

3. The driving circuit board of claim 1, wherein the driving circuit array forms one or more rows, each of which comprises one or more driving circuits, and one or more columns, each of which comprises one or more driving circuits, and the division into the two or more blocks comprises dividing the driving circuit array such that each of the two or more blocks comprises rows less than or equal to a threshold.

4. The driving circuit board of claim 3, wherein the threshold has a same bit size as image data.

5. The driving circuit board of claim 1, wherein the control of the first inspection comprises applying a clock signal to the two or more blocks and inputting first inspection data, a same clock signal being input to a driving circuit included in a same block.

6. The driving circuit board of claim 5, wherein the first inspection data comprises data having bit values all being high or data having bit values all being low.

7. The driving circuit board of claim 1, further comprising a detecting unit configured to detect a test current output from the plurality of driving circuits, wherein the selection of the driving circuits in the identified at least one column or row is based on the test current detected by the detecting unit.

8. The driving circuit board of claim 1, wherein the control of the second inspection comprises applying a clock signal to the identified at least one column or row and inputting second inspection data.

9. The driving circuit board of claim 8, wherein the second inspection data comprises data to verify a fault occurring in a memory cell included in the driving circuits in the identified at least one column or row.

10. A display apparatus comprising:

a light-emitting device array comprising a plurality of light-emitting devices; and a driving circuit board, wherein the driving circuit board is the driving circuit board according to of claim 1.

11. A method of controlling inspection of a driving circuit board, the method comprising:

dividing a driving circuit array comprising a plurality of driving circuits into two or more blocks;

performing a first inspection to inspect operations of each of the two or more blocks sequentially to identify which one of the two or more blocks causes an error, each block comprising at least two columns or rows of the driving circuits;

identifying at least one column or row of the identified block causing the error, based on a result of the first inspection; and performing a second inspection to inspect operations of driving circuits in the identified at least one column or row of the identified block to identify which driving circuit in the identified at least one column or row causes the error.

* * * * *